US011715710B2

(12) United States Patent
Bourjot et al.

(10) Patent No.: US 11,715,710 B2
(45) Date of Patent: Aug. 1, 2023

(54) METHOD OF TREATMENT OF AN ELECTRONIC CIRCUIT FOR A HYBRID MOLECULAR BONDING

(71) Applicant: Commissariat à l'Énergie Atomique et aux Énergies Alternatives, Paris (FR)

(72) Inventors: Emilie Bourjot, Grenoble (FR); Amandine Jouve, Grenoble (FR); Frank Fournel, Grenoble (FR); Christophe Dubarry, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/320,310

(22) Filed: May 14, 2021

(65) Prior Publication Data
US 2021/0366851 A1 Nov. 25, 2021

(30) Foreign Application Priority Data
May 19, 2020 (FR) ...................................... 2005055

(51) Int. Cl.
*H01L 23/00* (2006.01)
(52) U.S. Cl.
CPC ............. *H01L 24/03* (2013.01); *H01L 24/05* (2013.01); *H01L 24/08* (2013.01); *H01L 24/32* (2013.01); *H01L 24/92* (2013.01); *H01L 24/06* (2013.01); *H01L 24/80* (2013.01); *H01L 24/83* (2013.01); *H01L 2224/0392* (2013.01); *H01L 2224/03845* (2013.01); *H01L 2224/05016* (2013.01); *H01L 2224/05082* (2013.01); *H01L 2224/05562* (2013.01); *H01L 2224/05573* (2013.01); *H01L 2224/06517* (2013.01); *H01L 2224/08145* (2013.01); *H01L 2224/32145* (2013.01);
(Continued)

(58) Field of Classification Search
CPC ......... H01L 24/03; H01L 24/05; H01L 21/66; H01L 25/065; H10K 10/88
See application file for complete search history.

(56) References Cited

U.S. PATENT DOCUMENTS

| | | | | |
|---|---|---|---|---|
| 6,414,506 B2 * | 7/2002 | Akram | ................. | H05K 3/4007 324/762.01 |
| 8,802,538 B1 * | 8/2014 | Liu | ......................... | H01L 24/08 438/455 |

(Continued)

OTHER PUBLICATIONS

Preliminary Search Report for French Application No. 2005055, dated Jan. 29, 2021.

(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A method of treatment of an electronic circuit including at a location at least one electrically-conductive test pad having a first exposed surface. The method includes the at least partial etching of the test pad from the first surface, and the forming on the electronic circuit of an interconnection level covering said location and including, on the side opposite to said location, a second planar surface adapted for the performing of a hybrid molecular bonding.

14 Claims, 4 Drawing Sheets

(52) U.S. Cl.
CPC .............. *H01L 2224/80895* (2013.01); *H01L 2224/83896* (2013.01); *H01L 2224/9211* (2013.01)

(56) References Cited

U.S. PATENT DOCUMENTS

| | | |
|---|---|---|
| 10,515,874 B2 | 12/2019 | Hu et al. |
| 2017/0053844 A1* | 2/2017 | Tsai .................. H01L 23/3171 |
| 2019/0131277 A1 | 5/2019 | Yang et al. |

OTHER PUBLICATIONS

Bourjot et al., Towards a complete direct Hybrid Bonding D2W integration flow: Known-good-dies and die planarization modules development. IEEE 2019 International 3D Systems Integration Conference (3DIC). Oct. 8, 2019:1-5.

* cited by examiner

METHOD OF TREATMENT OF AN ELECTRONIC CIRCUIT FOR A HYBRID MOLECULAR BONDING

CROSS-REFERENCE TO RELATED APPLICATIONS

This application claims priority to French patent application number 2005055, filed May 19, 2020, the contents of which is incorporated herein by reference in its entirety.

TECHNICAL BACKGROUND

The present description generally concerns an electronic circuit treatment method, particularly the preparation of an electronic circuit to perform a hybrid molecular bonding.

PRIOR ART

An example of an electronic device manufacturing method comprises forming two integrated circuit plates, each comprising a surface corresponding to the free surface of an insulating layer having hybrid bonding metal pads (HBM) flush therewith, and bonding these surfaces to each other by hybrid molecular bonding, placing into contact the HBM pads of the two plates and the insulating layers of the two plates. The plates may then be cut to separate the electronic devices. Other examples comprise fastening by molecular bonding separate integrated circuit chips to an integrated circuit wafer or fastening by molecular bonding an integrated circuit chip to another integrated circuit chip.

The performing of a molecular bonding implies an adapted surface state, where the surface must in particular comply with strict flatness, roughness, and cleanness criteria. The obtaining of this adapted surface state generally implies a step of chemical-mechanical planarization of the integrated circuit wafers, also called CMP, which generally combines a chemical and mechanical etching. Such a method may require for the different materials present at the surface of the integrated circuit wafers to be substantially homogeneously distributed. This is why HBM pads of same dimensions, for example, having square or hexagonal shape, substantially homogeneously distributed across the surface, are used, where certain HMB pads are not electrically connected to other elements of the integrated circuit wafer and are only used for the hybrid molecular bonding.

The preparation of an electronic circuit for the performing of a hybrid molecular bonding comprises forming an additional interconnection level on the original electric circuit, called bonding interconnection level, particularly comprising depositing a stack of insulating layers and forming the HBM pads in the stack of insulating layers, some of the HBM pads being connected to conductive pads of the electronic circuit by conductive vias (HBV, hybrid bonding vias) formed in the stack of insulating layers.

For certain applications, it is desirable to be able to verify the proper operation of the original electronic circuit before the preparation of the original electronic circuit for the hybrid molecular bonding. For this purpose, it is known to provide conductive pads exposed at the surface of the original electronic circuit enabling to carry out tests. These tests may in particular be performed by using test probes which are applied against the test pads.

However, during the implementation of a method of preparation of the electronic circuit for the implementation of a hybrid molecular bonding, unwanted connections between the test pads and HBM pads may be observed.

SUMMARY

Thus, an object of an embodiment is to at least partly overcome the disadvantages of the previously-described methods of electronic circuit preparation for a hybrid molecular bonding.

Another object of an embodiment is for the preparation method to be compatible with conventional electronic circuit manufacturing methods.

An embodiment provides a method of treatment of an electronic circuit comprising at a location at least one electrically-conductive test pad having a first exposed surface, comprising at least partially etching the test pad from said first surface, and forming on the electronic circuit an interconnection level covering said location and comprising, on the side opposite to said location, a second planar surface adapted for the performing of a hybrid molecular bonding.

According to an embodiment, the interconnection level comprises electrically-conductive bonding pads exposed on the second surface.

According to an embodiment, the integrated circuit comprises at least one electrically-conductive contact pad, and one of the bonding pads is connected to the contact pad by at least one electrically-conductive via.

According to an embodiment, the electronic circuit comprises, before the forming of the interconnection level, an insulating layer covering the contact pad, covering the periphery of the test pad, and crossed by a hole exposing the first surface.

According to an embodiment, the at least partial etching of the test pad is performed through the hole by using the insulating layer as an etch mask.

According to an embodiment, the method comprises forming an etch mask covering the electronic circuit and comprising an opening totally or partly exposing the first surface and etching the test pad through said opening.

According to an embodiment, the etch mask is in contact with the first surface before the step of at least partial etching of the test pad.

According to an embodiment, the step of forming the interconnection level comprises a mechanical-chemical planarization step.

According to an embodiment, the method comprises, before the step of at least partial etching of the test pad, a step of testing of the electronic circuit comprising the application of at least one electrically-conductive probe against the test pad.

According to an embodiment, the method comprises the hybrid molecular bonding of the second surface to a third surface of another electronic circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the drawings or to an electronic circuit in a normal position of use. Unless specified otherwise, the expressions "around", "approximately", "substantially" and "in the order of" signify within 10%, and preferably within 5%. In the following description, the term "conductive" means electrically conductive and the term "insulating" means electrically insulating.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

The inventors have shown that unwanted connections of HBM pads during the preparation of an electronic circuit for a hybrid molecular bonding result from surface defects at the level of test pads of the electronic circuit that may prevent the proper carrying out of known methods of preparation of the electronic circuit for a hybrid molecular bonding.

Indeed, before the forming of the bonding interconnection level, all the conductive pads of the last metallization level of the electronic circuit are generally completely covered with an insulating layer, except for the test pads which are used to carry out tests before the preparation of the electronic circuit for a hybrid molecular bonding. The insulating layer covering the conductive pads of the last metallization level is thus opened to expose a portion of the surface of the test pads. These openings may cause the forming of abrupt steps. Further, the application of test probes to the test pad may cause the deformation of the surface of the test pad and particularly the forming of surface unevennesses of the test pad which makes the molecular bonding incompatible.

Figure 1:
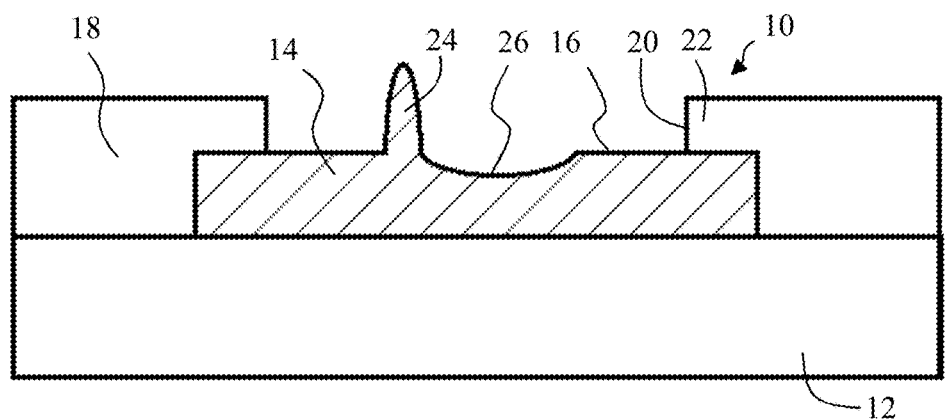
FIG. 1 shows a test pad of an electronic circuit after a test operation.

FIG. 1 is a partial simplified cross-section view of an electronic circuit 10 comprising a base 12, containing the substrate of the electronic circuit, of the electronic components, particularly of the transistors, and the lower metallization levels of electronic circuit 10. Electronic circuit 10 further comprises at least one conductive pad 14, called test pad hereafter, used for test operations before the preparation of electronic circuit 10 for a molecular bonding, test pad 14 resting on base 12 and comprising an upper surface 16. Electronic circuit 10 further comprises an insulating layer 18 covering base 12 and the periphery of test pad 14. Insulating layer 18 is generally formed all over base 12 and test pad 14 and a portion of the upper surface 16 of test pad 14 is exposed by locally etching an opening 20 in insulating layer 18, which causes the forming of an abrupt step 22 at the periphery of the exposed area of test pad 14 having a height from 500 nm to 3 µm. Further, the application of test probes on test pad 14 causes the deformation of the upper surface 16 of test pad 14, which has been illustrated by the forming of an asperity 24 and of a hole 26 schematically shown in FIG. 1.

Figure 2:
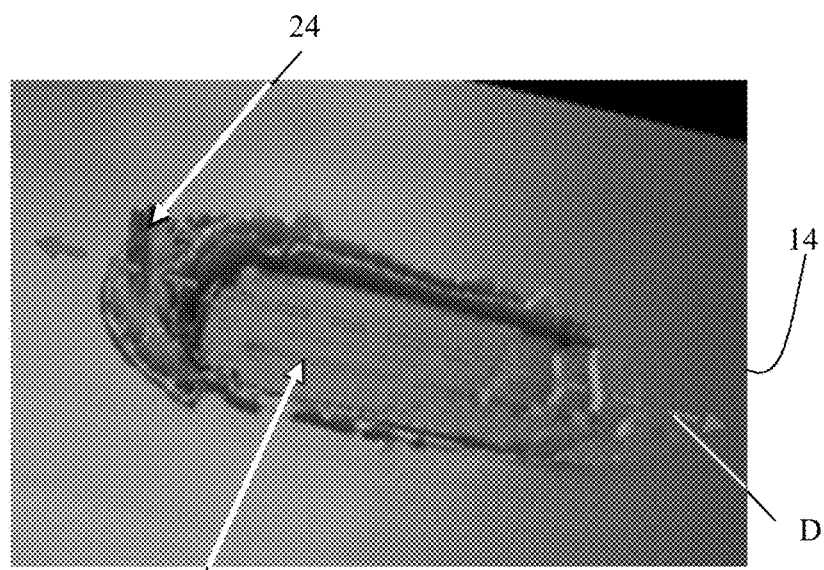
FIG. 2 is an image of a test pad after a test operation.

FIG. 2 is an image obtained by interferometry of a copper test pad 14 after a test operation. An asperity 24 and a recess 26 can in particular be observed.

Figure 3:
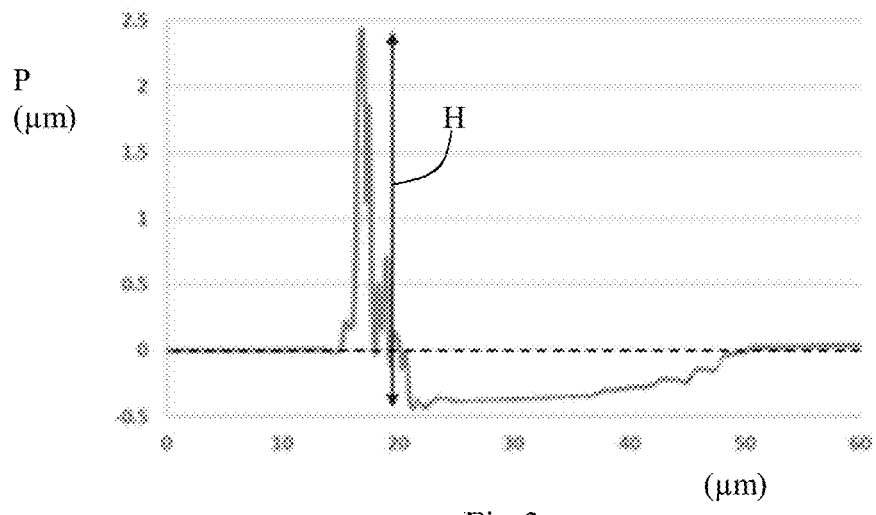
FIG. 3 is a curve of the profile of the test pad of FIG. 2.

FIG. 3 shows a curve of the variation of profile P of the surface of the test pad 14 of FIG. 2 according to the direction D indicated in FIG. 2. The maximum interval H between the top of asperity 24 and the bottom of recess 26 is approximately 3 µm. Generally, the inventors have shown that intervals H in the range from 150 nm to 5 µm can be observed.

Thereby, during the preparation of the electronic circuit for the performing of a hybrid molecular bonding, the inventors have shown that the first insulating layer of the bonding interconnection level which is deposited and which covers test pad 14 may be insufficiently thick to compensate for the unevennesses of the surface relief of electronic circuit 10, in particular when a CMP is performed subsequently, so that asperity 26 may be exposed.

It may be envisaged to increase the thickness of the stack of insulating layers of the bonding interconnection level, in particular the thickness of the first insulating layer deposited on test pad 14 and having the HBVs formed thereon. However, this may be impossible, on the one hand due to the height-to-width aspect ratio which would result therefrom for the opening to be formed in this insulating layer in order to form the HBVs, which may not be compatible with the techniques used to form these openings, and on the other hand, due to the increase in the electric resistances of these HBVs which would result therefrom and which may be incompatible with the electric properties desired for the interconnection level.

The inventors have shown that the addition of a step of partial or total etching of the test pad enables to be able to implement the subsequent steps of the method of integrated circuit preparation to a hybrid molecular bonding without the previously-described disadvantages.

FIGS. 4A to 4H are partial simplified cross-section view of an electronic circuit at successive steps of an embodiment of a method of preparing electronic circuit 10 for a hybrid molecular bonding and a method of hybrid molecular bonding of electronic circuit 10.

Figure 4A:
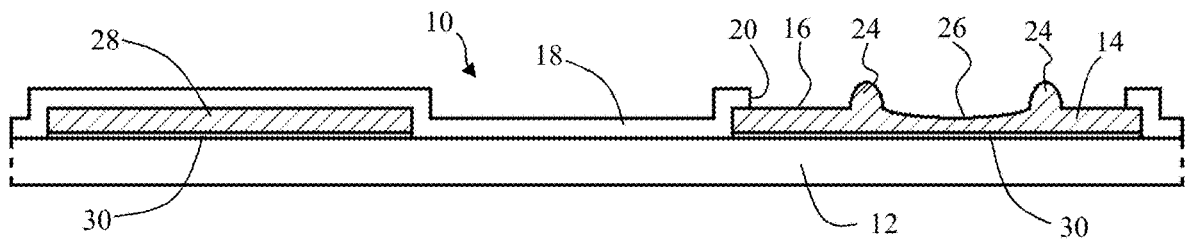
FIG. 4A illustrates a step of an embodiment of a method of preparing an electronic circuit for a hybrid molecular bonding.

FIG. 4A shows the structure obtained after the steps of manufacturing of electronic circuit 10, after operations of testing of electronic circuit 10, and before the implementation of the bonding interconnection level manufacturing steps. The steps of manufacturing of electronic circuit 10 particularly comprise the manufacturing of base 12, of test pads 14, a single test pad being shown in the right-hand portion of FIGS. 4A to 4H, as well as other conductive pads 28, called contact pads hereafter, a single contact pad being shown in the left-hand portion in FIGS. 4A to 4H, of insulating layer 18 and, for each test pad 14, of opening 20 in insulating layer 18, to expose a portion of the upper surface 16 of test pad 14. Contact pads 28 and test pads 14 may be simultaneously formed.

The test operations have caused a deformation, for at least certain test pads 14, resulting in the forming of asperities 24 and of a recess 26.

Each pad 14 and 28 may have a monolayer structure or a multi-layer structure. According to an embodiment, the layer or each layer of pad 14 or 28 may be made of aluminum (Al), of copper (Cu), or of an alloy of copper and of aluminum. According to an embodiment, each pad 14 and 28 may be formed on a layer 30 or a stack of layers playing the role of a bonding layer for the forming of pad 14 or 28 and/or of a barrier for the diffusion of the material forming pad 14 or 28. As an example, layer 30 may be made of titanium (Ti) or of titanium nitride (TiN). Layer 30 may have a thickness varying from 50 nm to 150 nm, for example, equal to approximately 70 nm. According to an embodiment, the thickness of each pad 14 and 28, outside of the areas possibly deformed for test pads 14, called average thickness hereafter, is in the range from 500 nm to 1.5 µm, for example, equal to approximately 975 nm. In top view, each pad 14 and 28 may have a contour inscribed with a square having a side length capable of varying from 50 µm to 200 µm.

Insulating layer 18 may have a monolayer structure or a multilayer structure. According to an embodiment, the single layer forming insulating layer 18 or each layer of insulating layer 18 is made of silicon oxide ($SiO_2$) or of silicon nitride (SiN). According to an embodiment, the total thickness of insulating layer 18 is in the range from 500 nm to 4 µm. According to an embodiment, for each test pad 14, the overlapping of the upper surface 16 of test pad 14 by insulating layer 18, measured from the lateral edge of test pad 14, is in the range from 1 µm to 3 µm, for example, equal to approximately 2 µm.

Figure 4B:
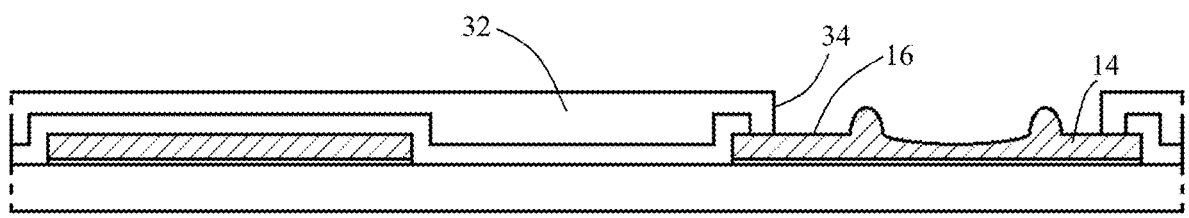
FIG. 4B illustrates another step of the preparation method.

FIG. 4B shows the structure obtained after the forming, on the structure shown in FIG. 4A, of an etch mask 32 comprising, for each test pad 14, an opening 34 exposing a portion of the upper surface 16 of test pad 14. According to an embodiment, etch mask 32 may be made of resist and the forming of each opening 34 may be performed by photolithography steps.

Figure 4C:
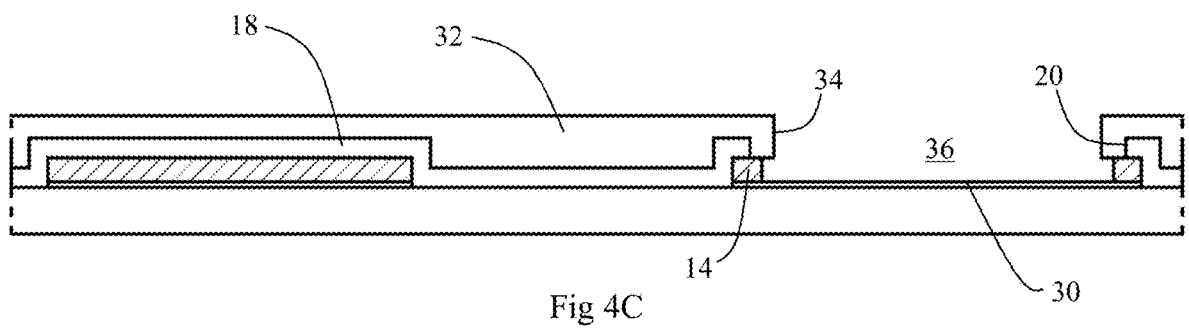
FIG. 4C illustrates another step of the preparation method.

FIG. 4C shows the structure obtained after the etching, through opening 34, of at least a portion of test pad 14 down to layer 30, which may play the role of an etch stop layer. The etching may correspond to a wet etching or to a dry etching, particularly by chlorinated chemistry. Advantageously, in the case of the chemical etching, the chemistry should etch the metal preferably over the dielectrics which are present: silicon oxide and/or silicon nitride. The wet etching may be an isotropic etching causing an etching of a portion of test pad 14 under mask 32, as shown in FIG. 4C. However, it may be desirable for the etching of test pad 14 not to extend under insulating layer 18 to avoid excessively fragilizing the structure for the subsequent manufacturing of the bonding interconnection level. For this purpose, for each test pad 14, the dimensions of opening 34 may be smaller than those of opening 20. According to an embodiment, the distance between the edge of the opening 34 formed in mask 32 and the edge of the opening 20 formed in resin layer 18 may be in the order of from 1 µm to 2 µm in the case where the thickness of test pad 14 is in the order of 1 µm. It is possible for test pad 14 not to be etched across its entire thickness. According to an embodiment, in the area where test pad 14 is etched, test pad 14 is etched across at least 50% of its average thickness, preferably across at least 70% of its average thickness. The etching of test pad 14 forms a cavity 36.

Figure 4D:
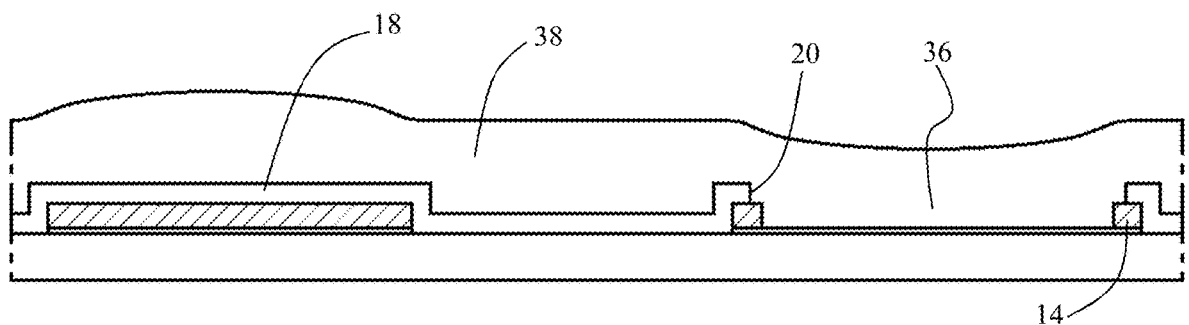
FIG. 4D illustrates another step of the preparation method.

FIG. 4D shows the structure obtained after the removal of mask 32 and the deposition of an insulating layer 38 over the entire structure, insulating layer 38 covering insulating layer 18 and filling cavity 36 through opening 20. Insulating layer 38 may have a monolayer structure or a multilayer structure. Each layer of insulating layer 38 may be made of one of the previously-described materials for insulating layer 18 or may be made of silane or of tetraethyl orthosilicate (TEOS). The thickness of insulating layer 38 particularly depends on the depth of cavity 36. The thickness of insulating layer 38 is greater than twice the thickness of test pad 14. According to an embodiment, the thickness of insulating layer 38 may be in the order of 3 µm for a cavity 36 having a 1.5-µm depth.

Figure 4E:
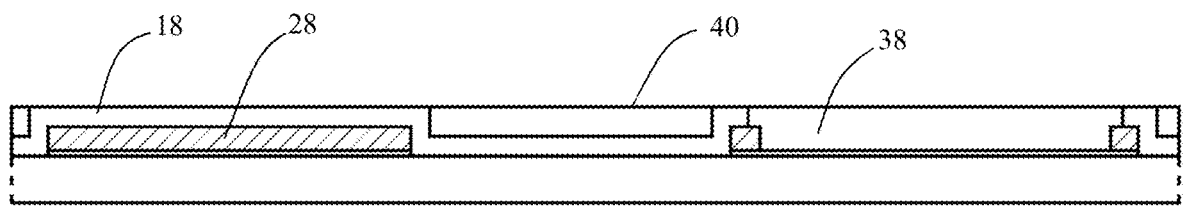
FIG. 4E illustrates another step of the preparation method.

FIG. 4E shows the structure obtained after a step of partial etching of insulating layer 38 to form a planar upper surface 40. The etching may be performed by CMP. After the etch step, the maximum interval between the recesses and the peaks present on upper surface 40 is smaller than 50 nm, preferably smaller than 20 nm. In the present embodiment, the etching of insulating layer 38 is stopped on insulating layer 18. As a variant, the etching of insulating layer 38 may be stopped before reaching insulating layer 18, that is, a portion of insulating layer 38 then remains present all over insulating layer 18, particularly at the level of contact pads 28, at the end of the etch step. According to another variant, an etch stop layer is provided before the deposition of insulating layer 38. The thickness of this stop layer varies from 30 nm to 100 nm.

Figure 4F:
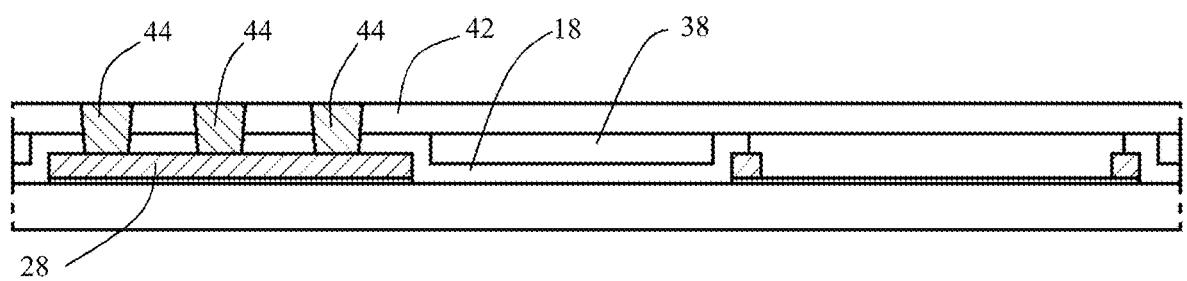
FIG. 4F illustrates another step of the preparation method.

FIG. 4F shows the structure obtained after the possible deposition of an insulating layer 42 on the structure shown in FIG. 4E and after the forming, for contact pad 28, of HBVs 44 crossing insulating layer 42, possibly insulating layer 38, and insulating layer 18, to come into contact with contact pad 28. Insulating layer 42, which may be omitted, may be made of the same material as insulating layer 38.

Figure 4G:
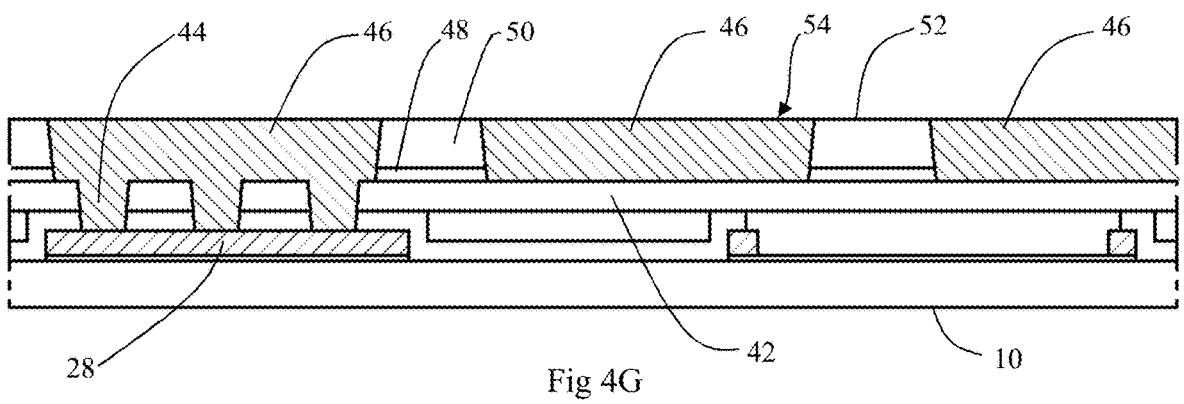
FIG. 4G illustrates another step of the preparation method.

FIG. 4G shows the structure obtained after the forming of HBM pads 46, three HBM pads 46 being shown as an example in FIG. 4G. This may comprise the forming of a stack of insulating layers on the structure shown in FIG. 4F, a stack of two insulating layers 48, 50 being shown as an example in FIG. 4G, and the forming of HBM pads 46 in the stack of insulating layers 48, 50. The forming of HBM pads 46 may comprise a CMP step causing the forming of a bonding surface 52 having its surface state adapted for the performing of a molecular bonding. HBM pads 46 may be made of copper. HBM pads 46 may be connected to contact pads 28 via HBVs 44 or may be electrically insulated. The assembly comprising insulating layers 42, 48, 50, HBVs 44, and HBMs 46 corresponds to the bonding interconnection level 54 added to electronic circuit 10 to allow the performing of a hybrid molecular bonding.

Figure 4H:
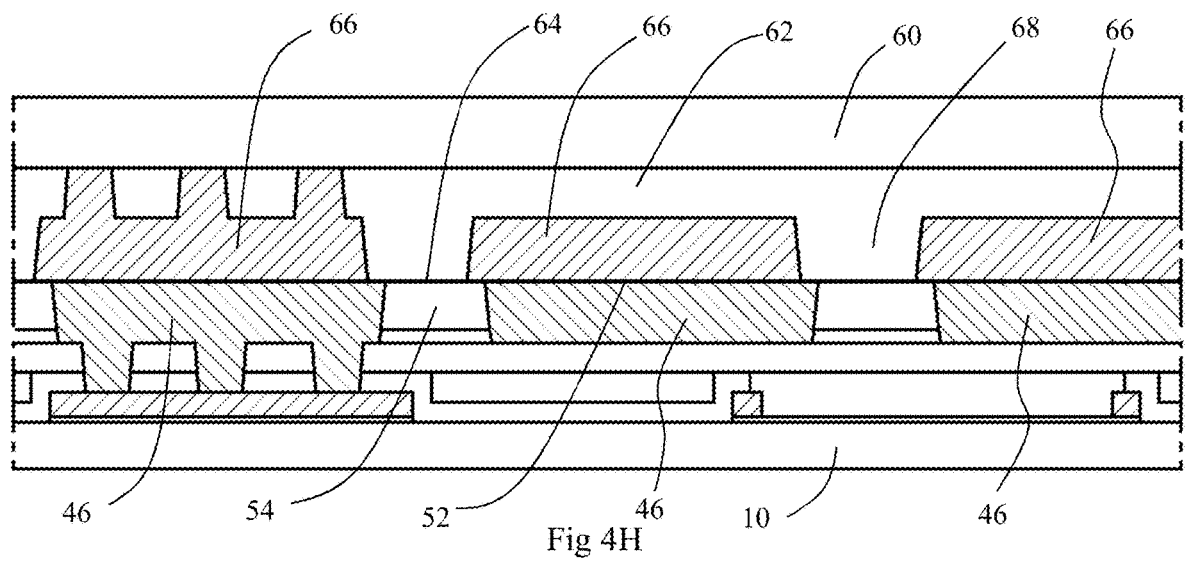
FIG. 4H illustrates another step of the preparation method.

FIG. 4H shows the structure obtained after the bonding, to surface 52, by hybrid molecular bonding, of an electronic circuit 60 to which a bonding interconnection level 62 has been added. Bonding interconnection level 62 comprises a bonding surface 64 having its surface state adapted for the performing of a molecular bonding. Bonding interconnection level 62 comprises, on the side of surface 64, HBM pads 66 separated by an insulating layer 68. The hybrid bonding is implemented so that the HBM pads 46 of bonding level 54 added to the prepared electronic circuit 10 come into contact with the HBM pads 66 of the bonding interconnection level 62 added to electronic circuit 60.

Figure 5A:
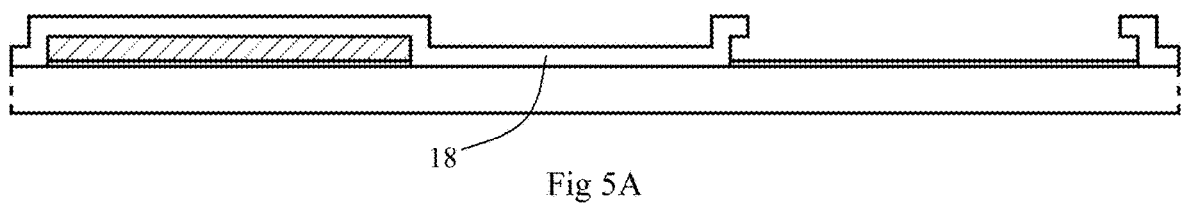
FIG. 5A illustrates a step of another embodiment of a method of preparing an electronic circuit for a hybrid molecular bonding.
Figure 5B:
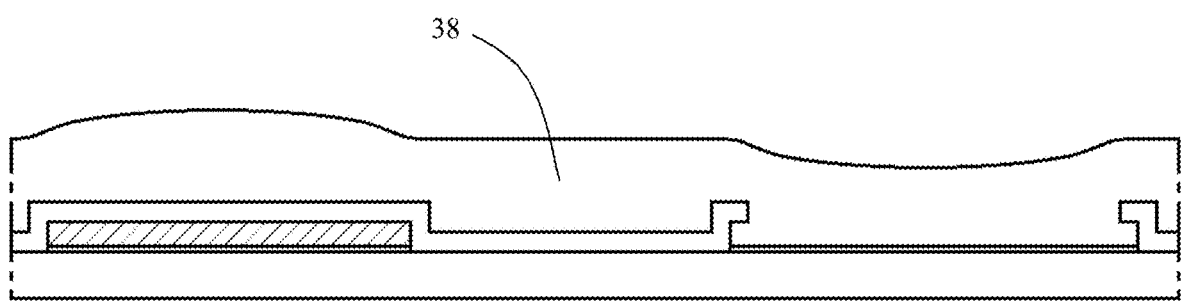
FIG. 5B illustrates another step of the preparation method.

FIGS. 5A and 5B show the structures obtained at successive steps of another embodiment of a method of preparing the electronic circuit for a hybrid molecular bonding.

The initial steps of the method correspond to the steps previously described in relation with FIG. 4A.

FIG. 5A shows the structure obtained after a step of etching of at least a portion of test pad 14, insulating layer 18 being used as an etch mask for the etching of test pad 14. Preferably, test pad 14 is entirely etched, as illustrated in FIG. 5A. The present embodiment advantageously enables to avoid the forming of an etch mask on insulating layer 18 for the etching of test pad 14.

FIG. 5B shows the structure obtained at a step similar to what has been previously described in relation with FIG. 4D and corresponds to the deposition of insulating layer 38 all over the structure shown in FIG. 5A.

Various embodiments and variants have been described. Those skilled in the art will understand that certain features of these various embodiments and variants may be combined, and other variants will occur to those skilled in the art. In particular, although the embodiment previously described in relation with FIGS. 4F and 4G corresponds to a manufacturing method where HBVs 44 and HMB pads 46 are formed by distinct steps of deposition of a conductive material, for example, by a method of simple damascene type, it should be clear that HBVs 44 and HBM pads 46 may be formed in a single step of deposition of a conductive material, for example, by a method of double damascene type. Further, although the previously-described embodiments concern an electronic device which comprises the stacking of two electronic circuits, it should be clear that the electronic device may comprise a stack of more than two electronic circuits, and the previously-described embodiments may apply to each interface between two adjacent electronic circuits of the stack.

Finally, the practical implementation of the described embodiments and variations is within the abilities of those skilled in the art based on the functional indications given hereabove.

The invention claimed is:

1. A method of treatment of an electronic circuit comprising at a location at least one electrically-conductive test pad having a first exposed surface, the method comprising at least partially etching the test pad from said first surface after a test of the electronic circuit, wherein, in the area where the test pad is etched, the test pad is etched across at least 50% of its average thickness, and forming on the electronic circuit an interconnection level covering said location and comprising, on the side opposite to said location, a second planar surface adapted for the performing of a hybrid molecular bonding.

2. The method according to claim 1, wherein the interconnection level comprises electrically-conductive bonding pads exposed on the second surface.

3. The method according to claim 2, wherein the electronic circuit comprises at least one electrically-conductive contact pad, and wherein one of the bonding pads is connected to the contact pad by at least one electrically-conductive via.

4. The method according to claim 2, wherein the electronic circuit comprises, before the forming of the interconnection level, a first insulating layer covering the contact pad, covering the periphery of the test pad and crossed by a hole exposing the first surface.

5. The method according to claim 4, wherein the at least partial etching of the test pad is performed through the hole by using the first insulating layer as an etch mask.

6. The method according to claim 4, wherein the periphery of the test pad covered with the first insulating layer is not etched.

7. The method according to claim 1, comprising forming an etch mask covering the electronic circuit and comprising an opening totally or partially exposing the first surface and etching the test pad through said opening.

8. The method according to claim 7, wherein the etch mask is in contact with the first surface before the step of at least partial etching of the test pad.

9. The method according to claim 1, wherein the step of forming of the interconnection level comprises a chemical-mechanical planarization step.

10. The method according to claim 1, comprising, before the step of at last partial etching of the test pad, a step of testing of the electronic circuit comprising the application of at least one electrically-conductive probe against the test pad.

11. The method according to claim 1, comprising the hybrid molecular bonding of the second surface to a third surface of another electronic circuit.

12. The method according to claim 1, wherein, in the area where the test pad is etched, the test pad is etched across its entire thickness.

13. The method according to claim 1, wherein the test pad is formed on a second layer, the at least partial etching of the test pad being performed to reach the second layer, the second layer being used as an etch stop layer.

14. The method according to claim 1, wherein the test pad is totally etched.

* * * * *